United States Patent [19]

Warren

[11] Patent Number: 4,587,522

[45] Date of Patent: May 6, 1986

[54] VEHICLE WARNING SYSTEM

[76] Inventor: Bob E. Warren, 4680 Temple Pl., Denver, Colo. 80236

[21] Appl. No.: 574,471

[22] Filed: Jan. 27, 1984

[51] Int. Cl.⁴ .......................... G08G 1/00; H03D 3/18

[52] U.S. Cl. ...................................... 340/902; 375/82; 455/35

[58] Field of Search .................. 340/902, 903; 455/99, 455/102, 227, 212, 345, 35; 329/104; 375/82; 381/107

[56] References Cited

U.S. PATENT DOCUMENTS

| | | | |
|---|---|---|---|
| 2,355,607 | 8/1944 | Shepherd | 340/33 |
| 3,412,378 | 11/1968 | Thomas | 340/34 |
| 3,558,911 | 1/1971 | Chen | 307/129 |
| 3,633,112 | 1/1972 | Anderson | 455/212 |
| 3,660,771 | 5/1972 | Balugani et al. | 375/82 |
| 3,670,250 | 6/1972 | Fritkin | 375/82 |
| 3,836,959 | 9/1974 | Pao et al. | 367/198 |
| 3,891,980 | 6/1975 | Lewis et al. | 340/572 |
| 3,902,123 | 8/1975 | Oomen | 455/212 |
| 3,992,656 | 11/1976 | Joy | 340/385 |

*Primary Examiner*—James J. Groody

*Attorney, Agent, or Firm*—H. Kenneth Johnston, II

[57] ABSTRACT

This system provides a warning or alert to persons in vehicles of the presence of emergency vehicles which are emitting audio warning signals. The system converts audio signals to discrete signals, which are also frequency indicative, and then determines whether the discrete frequency indicative signals represent warning signal frequencies. The system also determines whether any warning signal is of sufficient duration to be valid, and if they are, activates the warning device in the vehicle. The warning device may alert the vehicle occupants of emergency vehicles in the vicinity by either audio or visual alarms, or by both.

4 Claims, 4 Drawing Figures

VEHICLE WARNING SYSTEM

CROSS REFERENCE TO RELATED APPLICATION

This application is related to Ser. No. 249,153 filed Mar. 30, 1981, now abandoned, which was a continuation-in-part of 930,862 filed Aug. 3, 1978, now abandoned.

BACKGROUND OF THE INVENTION

1. Field of the Invention

The present invention relates to an electrical communication system for use with a vehicle in traffic, which system is actuated by the normal siren signal of another vehicle, such as an emergency vehicle.

2. Description of the Prior Art

Incident to the ever increasing use of streets and highways by motor vehicles is the problem of alerting the driver and occupants of vehicles to the presence of an emergency vehicle in the vicinity. The numbers of accidents involving emergency vehicles are increasing, much of the increase being due to the design of present motor vehicles and other forms of transportation. It is considered state-of-the-art automobile design to substantially eliminate external noise from the interior of present day automobiles to provide a quiet ride. Additionally, such vehicles often travel with their windows closed, and the air conditioner, radio, or other internal sound generating systems activated, thus rendering the warning devices of emergency vehicles inaudible or undetectable. Regardless of the reason, the number of accidents, injuries, and deaths resulting from collisions between emergency vehicles travelling in an emergency mode and other traffic becomes increasingly greater each year.

It is, therefore, an object of this invention to provide a means for warning the operator of a vehicle of the use of a siren or other warning device in the surrounding area, thus allowing the driver to avoid the emergency vehicle thus avoiding the needless disruption of emergency services, as well as injuries and damage which would be caused by a collision with an emergency vehicle.

Efforts at providing emergency warnings have been taught in the past. For example, U.S. Pat. No. 3,233,217 teaches the use of plurality of radio transmitter devices, each having a limited frequency range with a receiver designed to detect the specified transmitted frequency and identify the source of the signal. However, it is not responsive to the sound of an ordinary siren or car or train horn.

U.S. Pat. No. 3,673,560 employs a radio transmitter in an emergency vehicle and a special receiver in a vehicle tuned to that transmitter. Again, it is not responsive to ordinary warning sounds, such as sirens or horns.

U.S. Pat. No. 3,710,313 employs a radio transmitter which sends a recorded modulated voice transmission or repetative recorded message to a required receiver utilized with a standard car radio. Again, it is not responsive to and does not utilize means for sensing horns or sirens.

U.S. Pat. No. 3,760,349 employs a special transmitter in an emergency vehicle transmitting a distinct security code to a receiver in a vehicle.

U.S. Pat. No. 3,412,378 discloses an audio or visual warning system that has audio frequency and time duration discrimination, including a filter which may be tuned to accept any appropriate range of audio frequencies. However, it does not include means to convert the audio frequencies to discrete signals.

U.S. Pat. Nos. 3,902,123 and 3,633,112 show examples of digital squelch and frequency discrimination for audio output signals of a radio. Neither have any suggested utility for emergency audio sensing.

U.S. Pat. No. 3,836,959 shows timers activated by an input audio signal from a telephone and pulse shaping means. No utility for sensing emergency audio signals is taught or suggested.

U.S. Pat. No. 3,558,911 discloses an underfrequency relay that has a built in time delay to prevent actuation by instantaneous error signals, while U.S. Pat. Nos. 2,355,607 and 3,992,656 are examples of audio siren detector systems for controlling traffic signals.

It is thus seen that the primary state-of-the-art non-direct audio sensing means for alerting operators of vehicles in the vicinity of emergency vehicles is by radio transmitters, signaling their presence. Such warning means are extremely expensive and require the installation of special transmitting equipment in the emergency vehicle. In the single instance noted in which the system utilizes the audio emission, the vehicle requires a highly complex conversion device to detect the emergency vehicle's alarms and does not convert the signals to discrete signals.

SUMMARY OF THE INVENTION

The objects and advantages of the present invention are accomplished utilizing systems which sense the audio energy of a warning system external to a vehicle, such as a siren, and then convert the audio energy to another form, say an electrical signal idicative of both the frequency of each sound and the amplitude of each frequency. The resulting signals are then utilized to activate a timer and are also converted to discrete signals which are indicative of the frequency of the audio energy sensed. The discrete signals are then counted, and if found to be representative of a predetermined audio frequency or range of frequencies for a continuous predetermined period of time, an alarm circuit is activated which activates an alarm within the vehicle. Utilizing this system in a vehicle, a driver or occupant of the vehicle can be accurately alerted to a true audio warning signal, such as a siren, without the source having to have a special transmitter.

These, together with other objects and advantages, which will become subsequently apparent, reside in the details of construction and operation as more fully hereinafter described and claimed, reference being had to the accompanying drawings forming a part hereof, wherein like numerals refer to like parts throughout, and in which:

DESCRIPTION OF THE PREFERRED EMBODIMENTS

Figure 1:
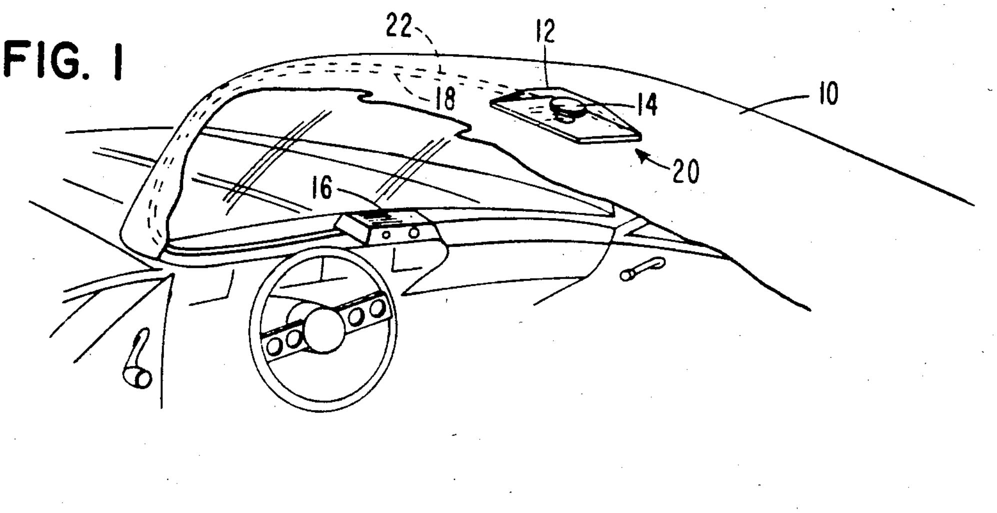
FIG. 1 is a schematic, prospective, broken away view illustrating one typical automotive vehicle installation for the warning system of the present invention.

Referring to FIG. 1, a schematic sketch of a portion of a vehicle 10 carrying receiver section 20 including shield 12, sensor 14, transmitter cable 18 and power cable 22 is shown. Shield 12 is preferably accoustically transparent, and is primarily provided to protect sensor 14 from weather and mechanical damage. Sensor 14 is preferably mounted to receive from 360 degrees audio signals of approaching emergency vehicles such as, for example, an emergency vehicle's siren. Audio signals received may be processed either adjacent to sensor 14 and then transmitted by cable 18 to indicator section 16, or may be transmitted by cable 18 to another location for processing. Portion 22 of cable 18 transmits power to sensor 14 and to the balance of the system from a power source, not shown, but typically the vehicles battery or electrical system. The approach of an emergency vehicle sounding a warning signal in the vicinity of a vehicle carrying the alarm system of the present invention results in the ultimate activation of indicator section 16, which in turn alerts the operator and any other occupants of the vehicle that there are emergency vehicles in the area. In accordance with the teaching of the present invention, the alarm may be visual or audible or both.

Figure 2:
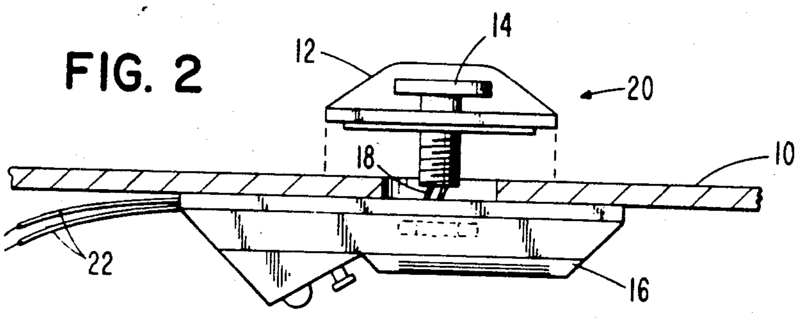
FIG. 2 is an enlarged view illustrating the system of FIG. 1, but modified as to the location of the alarm indicator.

FIG. 2 provides an enlarged view of sensor 14 modified as to the location of indicator 16. In this modification, sensor 14 transmits signals received through cable 18 to indicator 16 which is shown to be located in the ceiling of vehicle 10. Upon sensing audio warning signals of emergency vehicles in the area, the system of FIG. 2 activates the audible and/or visual indicators in ceiling indicator section 16. This arrangement also receives electrical power through cable 22.

Figure 3:
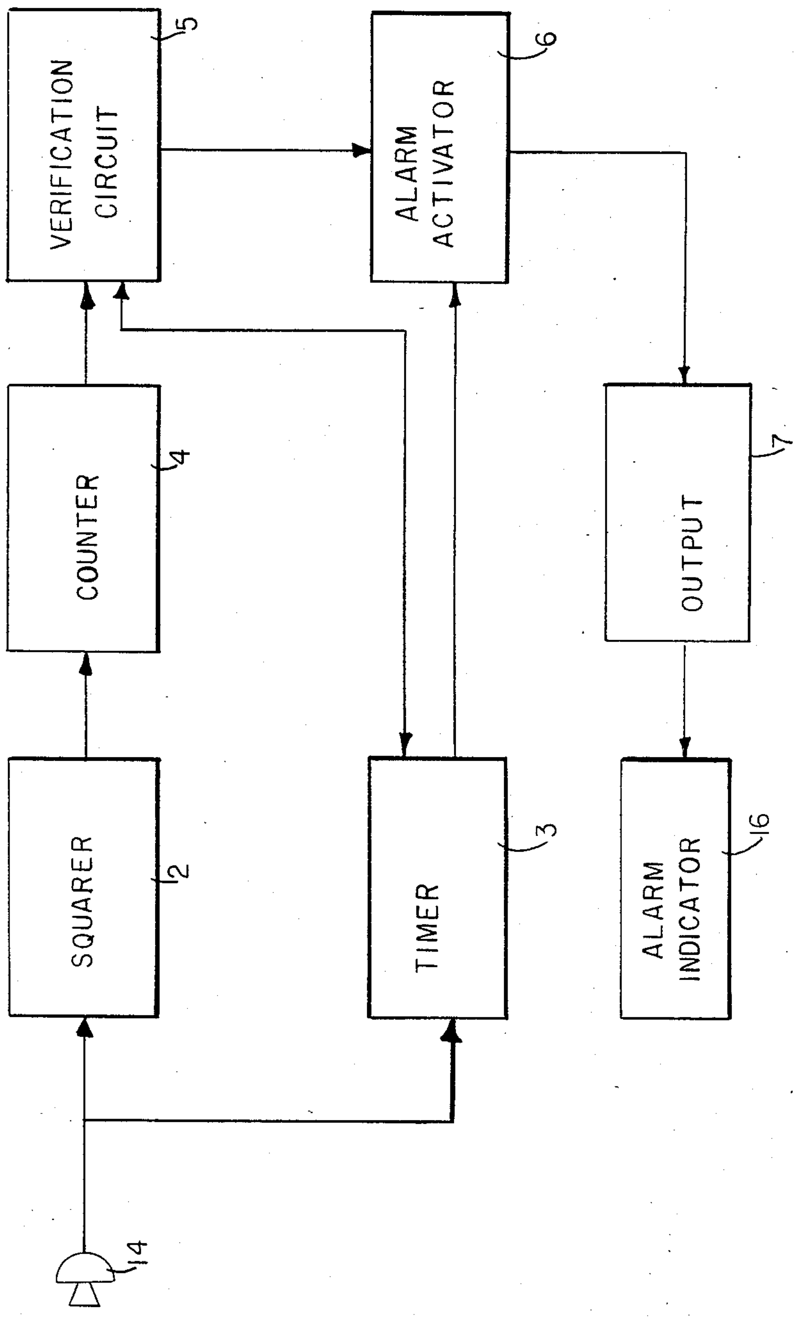
FIG. 3 is a schematic block diagram of a simplified system of the type contemplated by the present invention for installation in a vehicle to alert an operator.

Referring to FIG. 3, a simplified schematic embodiment is shown which operates in accordance with the teaching of the present invention. In this embodiment, audio sensing element 14 receives ambient audio energy. When it receives a warning signal, such as a siren, it directly activates both squarer 2 and timer 3. The output of squarer 2 is a discrete square or digital signal which activates and causes counter 4 to count while, as already noted, at the same time, timer 3 starts a time count for application to verification circuit 5. The discrete signals from squarer 2 are representative of the frequencies of the audio signals detected by sensor 14. Counter 4 is adjusted to determine when the frequencies represented by the discrete signals from squarer 2 are indicative of the frequencies of an audio warning signal. Verification circuit 5 is a related frequency determining element and repeatedly applies a "go" or "on" output to alarm activator circuit 6 which waits for a second activating input from timer 3. When both inputs to activator circuit 6 are "go", that is from timer 3 and verification circuit 5, alarm activator circuit 6 generates signal to output circuit 7 resulting in the activation of alarm 16 within the vehicle. If during any portion of the time cycle, verification circuit 5 does not record a proper count, between predetermined boundaries which are indicative of a warning signal frequency, then it will send out a reset signal to timer 3 and reset timer 3 to zero, to start the entire process over again.

Figure 4:
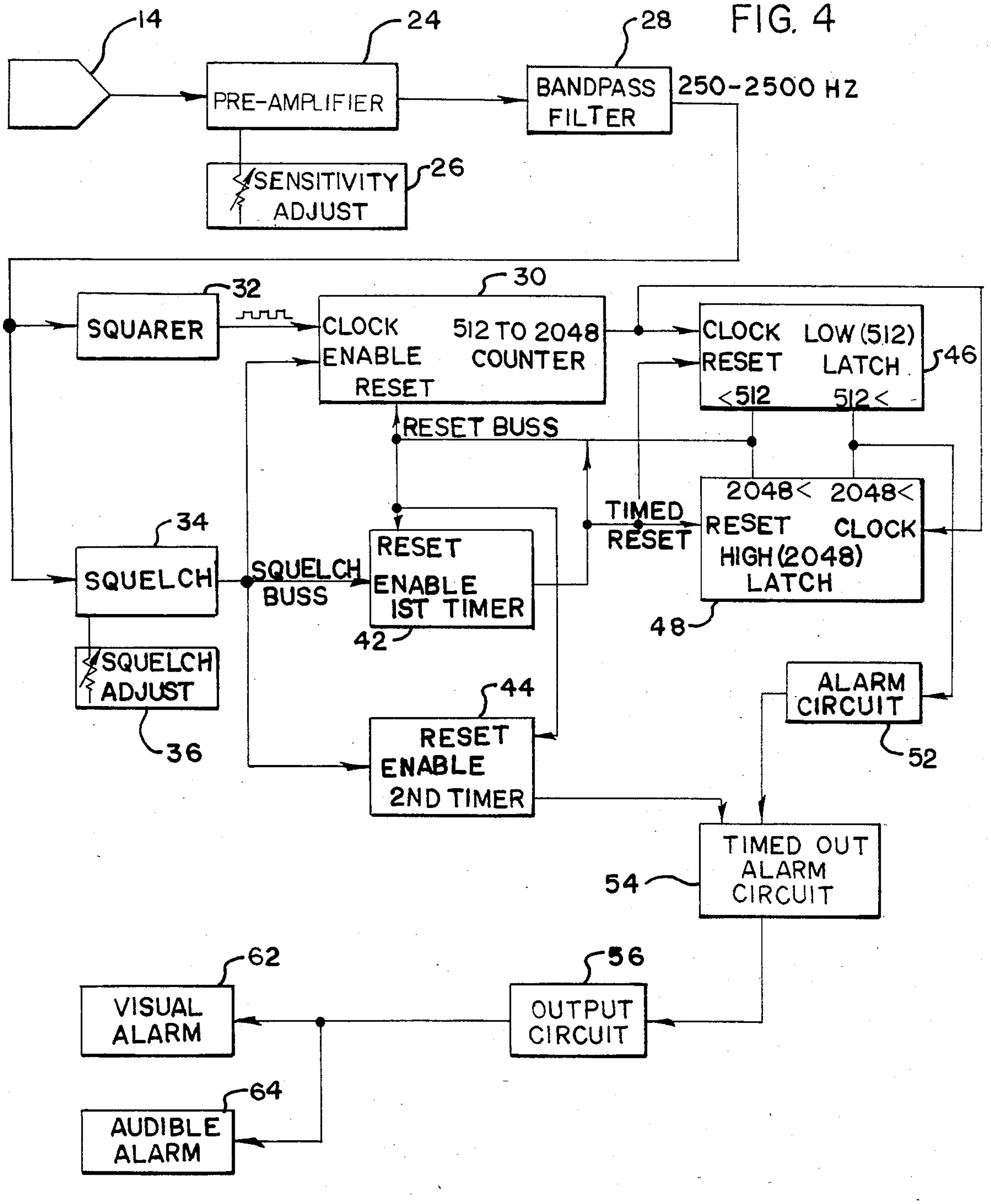
FIG. 4 is a more detailed schematic block diagram of a preferred embodiment of the present invention.

A more sophisticated and preferred embodiment of the present invention is schematically illustrated in FIG. 4. In FIG. 4 sensor 14 is an audio sensitive element similar, for example, to a microphone element. All sound energy for example in the range of about 20 Hz to 20 KHz is detected and converted, for example, to an electrical signal, by the transducing action of sensor 14. Sensor 14 may be any suitable type of transducer which converts sound energy to, for example electrical signals, which signals are indicative of both the frequencies which are sensed and the amplitude of each frequency. Sensor-transducer 14 may be static or dynamic. Sensor-transducers of the piezo-electric type are preferred as they provide electrical signals which are proportioned to the amplitude or loudness of each frequency of sound sensed. Normally the output of sensor 14 is extremely small, in the micro-volt range, and it is desirable to use preamplifier 24 to amplify the signal to a more usable level. Sensitivity adjust 26, for example a potentiometer, is provided and may be utilized to adjust the amount of gain or amplification provided by preamplifier 24. The amplified signal is then applied to band pass filter 28 included in this preferred embodiment to limit to a preselected range the frequency representing signals passed through the system, for example, signals representative of frequencies between about 250 Hz and about 2500 Hz. If the sensed and amplified signal is within the preselected acceptable range, to band pass filter 28, it is then applied to both squelch circuit 34 and squarer circuit 32. Until applied to the squarer circuit 32 the signal is analogue in character, as represented by the sinusoidal signal representation between preamplifier 24, filter 28 and squarer 32.

Squelch circuit 34, which determines the signal to noise ratio of the incoming signals, may be adjusted by squelch adjust 36. Since state-of-the-art sensor means 14 and preamplifier means 24 tend to center on the loudest sound being received at any time, squelch means 34 serves to examine the incoming signal with the greatest amplitude and to determine if it is sufficiently stronger than the rest of the amplified signals or "noise" to be considered as a definite or true signal. If squelch 34 does not register an adequate signal to noise ratio, no signal passes squelch 34, the signal is ignored and nothing happens in the system. Squelch adjust 36 may be set to a preselected level so that a certain amplitude of signal, representing a certain amplitude of sound, is required before the system is activated. Squelch adjust 36 may be set, for example, to substantially eliminate wind noise, crowd noise, and any other background audio signal which may be in the selected frequency range, from activating the alarm. In this preferred embodiment only, warning signals of the right frequency and of the proper strength will activate squelch 34 as controlled by squelch adjust 36 and activate the system, whereas other sounds will not normally have both the frequency and amplitude to activate squelch 34.

When the amplitude of the signal from the band pass filter means 28 exceeds the preset signal to noise ratio, as determined by the setting of squelch adjust 36, squelch 34 generates an output signal which is simultaneously applied to activate three circuits; counter means 30, first timer 42, and the adjustable/second timer 44. As explained in more detail below, in the operation of the present invention, the output of squelch means 34 must be maintained constantly from the time first timer 42 and second timer 44 are activated until a predetermined time controlled by second timer 44 elapses in order for an alarm to sound. If during this predetermined time the signal strength drops below the preset signal to noise ratio, squelch means 34 will terminate its output, causing first and second timers 42 and 44 to reset to zero, thus discontinuing the progress of the alarm signal through the monitor.

Signal output from band pass filter 28 is also applied to squarer 32. Squarer 32 transforms the incoming analogue signal, shown in FIG. 4 as a sinusoidal wave, into a precise discrete digital pulse signal shown, leaving squarer 32 as a square wave. This converted precise discrete or digital version of the incoming analogue signal is then applied to counter 30. The discrete square wave or other discrete form of signal provides a signal which can be counted by counter 30 with great precision and accuracy. Counter 30 counts each discrete signal, with each signal counted being representative of an audio frequency sensed by sensor 14.

At this point in the operation of the invention, several functions are carried out simultaneously, and the existing or normal state of certain variable conditions in the system must be understood prior to the explanation of each of these simultaneous functions. For example, low latch 46 and high latch 48 can produce either a "go" or "on" output or a "no-go" or "off" output. The normal condition of low latch 46 is a "no-go" signal output, while the normal condition of high latch 48 is a "go" signal output. Application of a predetermined input to either latch 46 or 48, respectively, will cause the signal output from that latch to switch to its second state, that is latch 46 to a "go" signal output and latch 48 to a "no-go" signal output. Application of a reset input to latches 46 and 48 causes them to return to or reset to their normmal signal output condition. In a similar manner first timer 42, second timer 44, alarm circuit 52 and time out alarm circuit 54 are normally in a "no-go" output condition, while first timer 42, second timer 44 and counter 30 are also normally at a zero time or count.

Now, as previously explained, when the output from squelch is received by counter 30, counter 30 starts counting the incoming discrete pulses which represent the frequency of the audio signal received by sensor 14 and transmitted to and converted to discrete signals by squarer 32. When the number of pulses counted by counter 30 reaches a predetermined number, or frequency representation, for example 512, an output signal is generated by counter 30 and applied to low latch 46. This causes the output of low latch 46 to change from its above described normal "no-go" output state to a "go" output state. Now, at this time the outputs from both the low latch 46 and the high latch 48 are in the "go" state since the normal output condition of the high latch is in the "go" state. These two "go" outputs are applied to alarm circuit 52. When both latch outputs to alarm circuit 52 are "go", the output of alarm circuit 52 changes from a "no-go" state to a "go" state. Now to change the output of time out alarm circuit 54 from its normal "no-go" condition to a "go" condition, both the output from alarm circuit 52 and the output from second timer 44 must be "go". Since the normal output state for second timer 44 is "no-go", output circuit 56 is not immediately activated when both latches 46 and 48 are in a "go" output condition, converting alarm circuit 52 to a "go" output state. Output circuit 56 is not activated until it receives both a "go" signal from alarm circuit 52 and second timer 44.

Now, in operation, in response to signal output from squelch 34, counter 30 is activated and counting and first timer 42 and second timer 44 are also activated and operating. After a predetermined time duration, say one second has elapsed, first timer 42 changes to a "timeout" condition and generates an output signal, "1 second reset", which resets counter means 30, high latch 48, and low latch 46. If a count of less than 512 has occured then when first timer 42 generates "1 second reset", low latch 46 is reset, and will generate "less than 512 disable" and reset second timer 44. If however the count was greater than 512 when the first timer 42 generated the "1 second reset", the low latch 46 is reset without generating "less than 512 disable". If the count was greater than 2048 at any time prior to the first timer 42 generating the "1 second reset", high latch 48 generates an output pulse "greater than 2048 disable", which resets first timer 42. The only condition which will allow the second timer to proceed to generate a valid output, "3 second timeout", is if for say, three 1 second intervals, the low latch 46 is always "go", i.e., the count for each 1 second interval is always greater than 512, and that the high latch 48, is always go for each interval, i.e., in each of the 3 second intervals no count has exceeded 2048. The purpose of the counter 30, high latch 48, low latch 46, first timer 42, and second timer 44, is to insure that for a specified interval, say 3 seconds, that significant signal energy in the frequency range of 520 to 2000 Hz is present, and that the squelch circuit 34 is not responding to an out of band signal.

In order for alarm circuit 52 and time out alarm circuit 54 to be activated, the count from counter 30 must be between the predetermined low latch 46 and high latch 48 limits; for example, between 512 and 2048 during each predetermined first timer 42 period, say one second, then the outputs from low latch 46 and high latch 48 will both be "go" during that time. The application of both these "go" outputs from latches 46 and 48 to alarm circuit 52 causes alarm circuit 52 to change its output state to the "go" condition. However, no output is generated from time out alarm circuit 54 at this time because the input from second timer 44 is still "no-go" until it reaches its predetermined time, for example, three seconds. However, when second timer 44 reaches its predetermined interval, its output changes from "no-go" to a "go" condition. Then, if during the next first predetermined time period the outputs from low latch 46 and high latch 48 are both "go", then alarm circuit 52 gener-ates a "go" output to time out alarm circuit 54. This "go" signal to time out circuit 54 coupled with the "go" signal from second timer 44 causes a "go" output from time out alarm circuit 54 which is applied to output circuit 56. The signal from output circuit 56 activates either audible alarm 62, or visual alarm 64, or both.

As an aid to understandng the present invention, it may be considered that the action of timer 42 and latches 46 and 48, check the discrete frequency signals for proper upper and lower limits during each predetermined first time period, say one second. If the frequency stays between the limits for each and every predetermined first time period, until second timer 44 times out, then the chain of alarm circuitry 52, 54 and 56 are activated to generate an alarm.

Several variations may be made within the teaching of the present invention. For example, as shown in phantom in FIG. 4, low latch 46 may be connected to high latch 48 by a trigger count line. This trigger count line allows the system to be adjusted so that high latch 48 is activated to a partial count equivalent to the low latch count in response to low latch 46 having completed its count activation. This would be in addition to having the high latch 48 activated by a predetermined output from the counter 30, either of which activating signals would indicate that the count has exceeded the limit of high latch 48.

In other modifications, not shown, band pass filter 28, squelch circuit 34 and squelch adjust 36, may be deleted and the circuitry still be a fully functional audio warning signal monitor. In another modification, the reset signal from latches 46 and 48 could be applied directly to counter 30 and timers 42 and 44, instead of waiting for the passage of a predetermined period of time. In yet another modification, squelch 34 may be eliminated, or at least its activating function eliminated, and the output of squarer 32 could be used to trigger the counter 30 and timers 42 and 44. The elimination of squelch 34 would result in a more constant, but less well defined operation. In a system in which squelch 34 is present, it could be connected to counter 30 and latches 46 and 48 to provide a reset function. Preamplifier 24 and sensitivity adjust 26 may also be deleted from the circuitry, but this change would seriously decrease the effective range or sensitivity of the system. It would also be possible, for example, to combine alarm circuit 52 and time out alarm circuit 54 into a single function. This would allow it to operate as either two dual input "and" gates in tandem, or as a single free input "and" gate.

In preferred embodiments, a band pass filter 28 is utilized to limit the frequencies of the signals which are available to the system, but filter 28 is not intended to limit the signals to signals representing the frequencies being counted by latches 46 and 48. For example, band pass filter 28, in practice has been selected to pass between 250 Hz and 2500 Hz. This is a broad enough frequency range to allow the signals corresponding to the warning signal frequencies to reach squelch 34, and squarer 32 while eliminating a great amount of ambient noise which would not normally be related to warning signal activity, to reach the system. The actual counting of the discrete equivalent of the frequency and discrimination as to its range is done by counter 30 and latches 46 and 48. Clearly it is within the teaching of the present invention to select any desired frequencies, either for filtering or for counting and sensing within the system.

As precedent to the present invention, it should be known and understood and is hereby taught, that there exists today within the United States of America and within most other countries of the world, standard frequency ranges for audio warning devices. For example, within existing standards, vehicle warning sirens must have frequencies within the range from a low of about 512 Hz to a high of about 1024 Hz, or 1536 Hz or 2048 Hz. They must also have a minimum amplitude. As is well known to even a casual listener, both the standard frequency ranges and the minimum amplitude of such warning siren falls well outside of the range of normal ambient street or highway noise. Therefore, in the practice of the present invention, the counter and/or counter and latch system may be set to coincide with known standard warning siren frequency ranges. The present invention's selective exclusion of signals representative of non-siren frequencies substantialy eliminates the possibility of processing signals representative of non-siren frequencies which would erroneously activate the alarm system. However, the system may also be tuned to detect the unique frequencies of automobile or locomotive horns, squealing tires, or even bells or whistles. But, its primary intended and expected use is for siren detection.

It is, therefore, seen that the objects of the present invention are met, including the object of providing an alarm system which determines frequency by converting signals representative of the audio frequencies to discrete signals, and by providing means which count and determine the duration of the discrete signals to assure that the alarm system is only activated by audio signals of both a predetermined frequency range and of a predetermined minimum duration. The object of providing means warning the operator of a vehicle of the use of a siren or warning device in the vicinity is also met.

It, therefore, will be understood that various changes and modifications to the preferred embodiments described herein are possible, and will be apparent to those skilled in the art. Such changes and modifications can be made without departing from the spirit and scope of the present invention. Therefore, while the foregoing preferred embodiments have been described and illustrated, it is understood that alterations and modifications may be made thereto and still fall within the scope of the invention as claimed.

What is claimed is:

1. A warning system for a vehicle or the like comprising: means for receiving and sensing audio energy and for transducing such audio energy to output signals indicative of the frequencies, and of the amplitude of each frequency, of the audio energy sensed; means for converting output signals from said sensor means to discrete output signals representative of the frequencies of the audio energy received by said sensor means, said signal converting means being in output signal receiving contact with said sensor means; means for measuring the time during which signals are transmitted by said sensor means, and which, after one or more predetermined time period, transmits activating signals, said timer means being in output signal receiving contact with said sensor means; means for counting the discrete signals output by said signal converting means, said counter means being in discrete signal receiving contact with said converting means, and which, after making one or more predetermined count transmits an activating signal; and means for activating an alarm, said alarm activating means being in activating signal receiving contact with both said timer means and said counter means, whereby, when predetermined activating signals are received by said alarm activating means from both said timer means and said counter means said alarm activating means generates alarm activating signals.

2. The warning system of claim 1 in which the alarm activating means includes at least a first switch and a second switch, said switches being in activating signal receiving contact with both said timer means and said counter means, each said switch normally being in either a signal transmitting condition or in a signal non-transmitting condition, whereby, in response to predetermined signals from said counter means said switches produce an alarm activating signal.

3. The warning system of claim 2 in which one said switch is normally in a signal non-transmitting condition; a second said switch is normally in a signal transmitting condition, and in which predetermined activating signals from said counter means maintain at least one switch signal nontransmitting or both switches signal transmitting to thereby either not produce or to produce alarm activating signals indicative of the audio frequencies sensed by the system.

4. The warning system of claim 2 in which the switches are latches.

* * * * *